(12) United States Patent
Tian et al.

(10) Patent No.: US 11,404,496 B2
(45) Date of Patent: Aug. 2, 2022

(54) ARRAY SUBSTRATE AND PREPARATION METHOD THEREOF AND DISPLAY DEVICE

(71) Applicant: BOE Technology Group Co., Ltd., Beijing (CN)

(72) Inventors: Hongwei Tian, Beijing (CN); Yanan Niu, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 225 days.

(21) Appl. No.: 16/765,220

(22) PCT Filed: Dec. 16, 2019

(86) PCT No.: PCT/CN2019/125760
§ 371 (c)(1),
(2) Date: May 19, 2020

(87) PCT Pub. No.: WO2020/143407
PCT Pub. Date: Jul. 16, 2020

(65) Prior Publication Data
US 2021/0202591 A1    Jul. 1, 2021

(30) Foreign Application Priority Data

Jan. 9, 2019 (CN) .......................... 201910019403.3

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/041* (2013.01); *G06F 3/147* (2013.01);
(Continued)

(58) Field of Classification Search
CPC .... G06F 3/041; G06F 3/0412; G06F 3/04164; G06F 3/147; G06F 2203/04103;
(Continued)

(56) References Cited

U.S. PATENT DOCUMENTS

2014/0175972 A1   6/2014   Lee et al.
2015/0169094 A1   6/2015   Liu et al.
(Continued)

FOREIGN PATENT DOCUMENTS

CN   101667075 A   3/2010
CN   103579294 A   2/2014
(Continued)

OTHER PUBLICATIONS

First Office Action for related Chinese Patent Application No. 201910019403.3 dated May 27, 2020.
(Continued)

*Primary Examiner* — Allan R Wilson
(74) *Attorney, Agent, or Firm* — ArentFox Schiff LLP; Michael Fainberg

(57) ABSTRACT

Provided is an array substrate and a preparation method thereof and a display device, to improve performance and yield of display products. An embodiment of the present disclosure provides an array substrate, where the array substrate is divided into a display area and a surrounding area arranged outside the display area; the array substrate includes: a substrate, electroluminescent devices and an encapsulation layer disposed on the substrate in the display area, the encapsulation layer configured to encapsulate the electroluminescent device, and a touch function layer disposed on the encapsulation layer; the touch function layer includes a touch lead extending from the display area to the surrounding area; and the array substrate further includes: a thickness compensation layer located in the surrounding
(Continued)

area and disposed between the substrate and the touch lead layer.

17 Claims, 3 Drawing Sheets

(51) Int. Cl.
    *G06F 3/147*     (2006.01)
    *H01L 51/52*     (2006.01)
    *H01L 51/56*     (2006.01)

(52) U.S. Cl.
    CPC .......... *H01L 51/5253* (2013.01); *H01L 51/56* (2013.01); *G06F 2203/04103* (2013.01)

(58) Field of Classification Search
    CPC ... H01L 27/12; H01L 27/323; H01L 51/5246; H01L 51/5253; H01L 51/56
    See application file for complete search history.

(56) References Cited

U.S. PATENT DOCUMENTS

| | | | |
|---|---|---|---|
| 2016/0165677 A1 | 6/2016 | Lee et al. | |
| 2016/0218151 A1 | 7/2016 | Kwon et al. | |
| 2016/0378224 A1* | 12/2016 | Kwon | ................ H01L 51/5256 345/174 |
| 2017/0277292 A1 | 9/2017 | Park et al. | |
| 2017/0301736 A1 | 10/2017 | Wang et al. | |
| 2017/0358769 A1 | 12/2017 | Kim | |
| 2018/0348934 A1* | 12/2018 | Matsumoto | ........... G06F 3/0445 |
| 2019/0165325 A1* | 5/2019 | Lee | ........................ G06F 3/0412 |
| 2020/0075880 A1 | 3/2020 | Wen et al. | |
| 2020/0203657 A1 | 6/2020 | Xiao et al. | |

FOREIGN PATENT DOCUMENTS

| | | |
|---|---|---|
| CN | 103904098 A | 7/2014 |
| CN | 104393189 A | 3/2015 |
| CN | 105679790 A | 6/2016 |
| CN | 105824457 A | 8/2016 |
| CN | 106068564 A | 11/2016 |
| CN | 107068905 A | 8/2017 |
| CN | 107492563 A | 12/2017 |
| CN | 109148722 A | 1/2019 |
| CN | 109728004 A | 5/2019 |
| TW | M489328 U | 11/2014 |

OTHER PUBLICATIONS

Second Office Action for related Chinese Patent Application No. 201910019403.3 dated Oct. 26, 2020.

* cited by examiner

ARRAY SUBSTRATE AND PREPARATION METHOD THEREOF AND DISPLAY DEVICE

CROSS REFERENCE TO RELATED APPLICATIONS

The present disclosure is a US National Stage of International Application No. PCT/CN2019/125760, filed on Dec. 16, 2019, which claims the benefit of Chinese Patent Application No. 201910019403.3, filed with the Chinese Patent Office on Jan. 9, 2019 and entitled "Array Substrate and Preparation Method Thereof and Display Device", which is hereby incorporated by reference in its entirety.

FIELD

The present disclosure relates to the field of display technology, in particular to an array substrate and a preparation method thereof and a display device.

BACKGROUND

Organic electro luminescent display (OLED) panel has gradually become a main stream in the display field, by virtue of its outstanding performances of low power consumption, high color saturation, wide viewing angle, thin thickness and capability of realizing flexibility. OLED can be widely applied to such terminal products as a smart phone, a tablet personal computer and a television.

SUMMARY

An embodiment of the present disclosure provides an array substrate, where the array substrate is divided into a display area and a surrounding area arranged outside the display area. The array substrate includes: a substrate, electroluminescent devices and an encapsulation layer disposed on the substrate in the display area, where the encapsulation layer is configured to encapsulate the electroluminescent devices, and a touch function layer disposed on the encapsulation layer; the touch function layer includes a touch lead extending from the display area to the surrounding area. The array substrate further includes: a thickness compensation layer located in the surrounding area and disposed between the substrate and the touch lead layer.

Optionally, the thickness compensation layer includes an encapsulation structure which is in the same layer as the encapsulation layer.

Optionally, a gap is provided between the encapsulation structure and the encapsulation layer, and the thickness compensation layer further includes a filling structure filling the gap.

Optionally, the encapsulation structure includes a plurality of sub-encapsulation structures which are arranged at intervals in a direction from the display area to the surrounding area; and the thickness compensation layer further includes filling structures filling in gaps between the plurality of sub-encapsulation structures.

Optionally, the material of the filling structure is one or a combination of ink-jet printing ink and protective adhesive.

Optionally, the array substrate further includes a protective layer disposed on the encapsulation layer and the thickness compensation layer, and the protective layer is disposed under the touch function layer.

Optionally, the distance between the touch lead layer and the substrate in the surrounding area is equal to the distance between the touch function layer and the substrate in the display area.

A preparation method of an array substrate is provided in an embodiment of the present disclosure, and the method includes:

forming, on a substrate, electroluminescent devices, an encapsulation layer and a thickness compensation layer; where the encapsulation layer is configured to encapsulate the electroluminescent device;

where the array substrate comprises a display area and a surrounding area arranged outside the display area, and the electroluminescent device is located in the display area, and the thickness compensation layer is located in the surrounding area; and forming a touch function layer on the encapsulation layer, wherein the touch function layer comprises a touch lead layer extending from the display area to the surrounding area, and the thickness compensation layer is disposed between the substrate and the touch lead layer.

Optionally, the step of forming, on a substrate, the electroluminescent devices and the encapsulation layer located in the display area, and a thickness compensation layer located in the surrounding area, where the encapsulation layer is configured to encapsulate the electroluminescent devices, specifically includes:

forming the electroluminescent devices on the substrate in the display area; and forming, by adopting a packaging process, the encapsulation layer and an encapsulation structure; wherein the encapsulation layer is formed to encapsulate the electroluminescent devices, and encapsulation structure is formed in the surrounding area and in the same layer as the encapsulation layer.

A display device provided in an embodiment of the present disclosure includes the above array substrate provided in the embodiment of the present disclosure.

DETAILED DESCRIPTION OF THE EMBODIMENTS

In a display device, the touch function is widely used, and it has become a focus of the current development to integrate a flexible metal line on common (FMLOC) with a touch function onto a display device. In the current stage, FMLOC is built on an encapsulation structure based on thin film encapsulation (TFE), while related TFE encapsulating thickness is relatively large, due to a segment difference between the TFE encapsulation and a back plate, in the processes of film formation, exposure, developing and etching, the pattern required to be removed is difficult to be completely removed in a transition area and an area with a relatively-small segment difference, thereby leading to metal residue in the FMLOC lead area, and further leading to short circuit of a lead. Even though patterning is performed with strong exposures by multiple times, the risk of metal residue is still high. Meanwhile, due to multiple exposures, a greater difference is caused in terms of uniformity of lines in different areas, thereby further influencing product performance and yield. In summary, in the related technologies, in the process of integrating the FMLOC onto a display device, since a segment difference between the TFE encapsulation and the back plate, metal residues in the FMLOC lead area, thereby influencing product performance and yield.

In order to more clearly illustrate technical solutions in embodiments of the present disclosure, a brief introduction will be given below on accompanying drawings which need to be used in the description of the embodiments. Apparently, the accompanying drawings described below are merely some embodiments of the present disclosure. Those skilled in the art can obtain other accompanying drawings according to these drawings without any creative effort.

Figure 1:
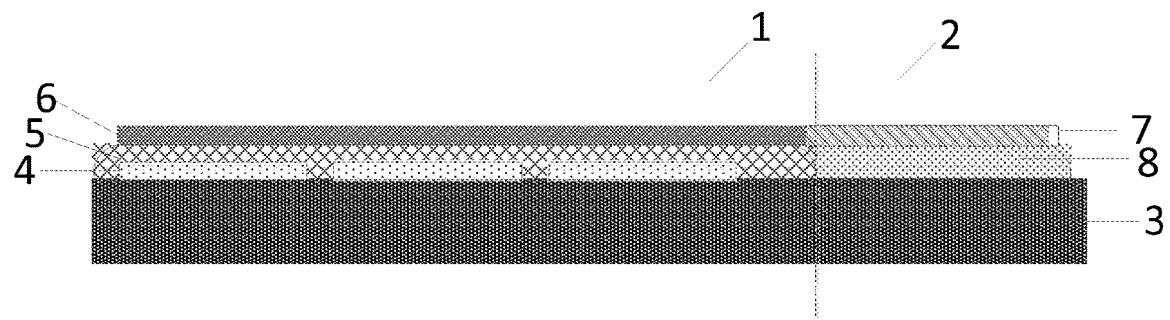
FIG. 1 is a structural schematic diagram of an array substrate provided in an embodiment of the present disclosure.

An embodiment of the present disclosure provides an array substrate, as shown in FIG. 1, the array substrate is divided into a display area 1 and a surrounding area 2 located outside the display area 1; the array substrate includes: a substrate 3, electroluminescent devices 4 disposed on the substrate 3 in the display area 1, an encapsulation layer 5 configured to encapsulate the electroluminescent devices 4, and a touch function layer 6 disposed on the encapsulation layer 5. The touch function layer 6 includes a touch lead 7 extending from the display area 1 to the surrounding area 2. The array substrate further includes: a thickness compensation layer 8 located in the surrounding area 2 and disposed between the substrate 3 and the touch lead 7.

As to the array substrate provided in the embodiment of the present disclosure, a thickness compensation layer is provided between the touch lead and the substrate, thereby reducing segment difference of the area in which the touch lead is located, avoiding residue of lead materials in the process of manufacturing a touch lead, avoiding short circuit of the lead, and improving performance and yield of the display products. Moreover, no additional strong exposure process is required to remove residual lead materials, thereby simplifying the preparation process of an array substrate.

Figure 2:
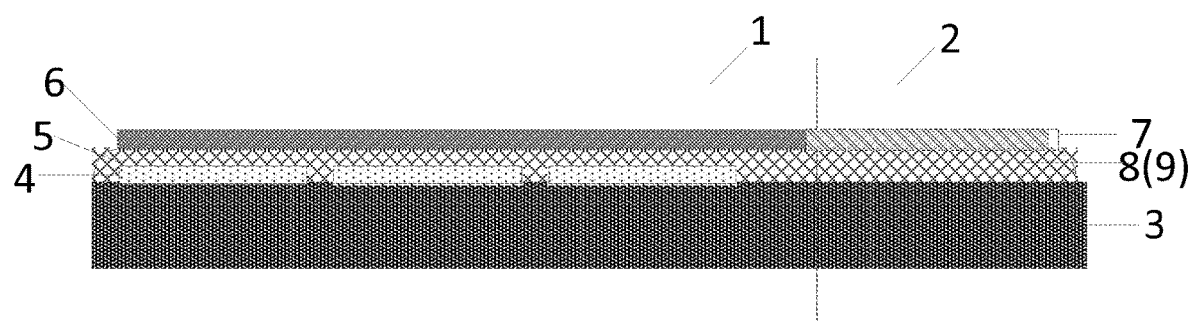
FIG. 2 is a structural schematic diagram of another array substrate provided in an embodiment of the present disclosure.

Optionally, as shown in FIG. 2, the thickness compensation layer 8 includes an encapsulation structure 9 which is disposed in the same layer as the encapsulation layer 5.

In the array substrate provided in an embodiment of the present disclosure, the encapsulation structure in the thickness compensation layer is disposed in the same layer as the encapsulation layer, that is, the encapsulation structure and the encapsulation layer are formed in the same process, thereby reducing the segment difference of the area in which the touch lead is located without adding additional processes.

It should be noted that, as to the array substrate provided in the embodiment of the present disclosure, the substrate includes: a base substrate and a pixel circuit arranged on the base substrate, and the base substrate can be a hard base plate or a flexible base plate. In the array substrate provided in the embodiment of the present disclosure, the encapsulation layer and the encapsulation structure can be, for example, formed by an organic layer and an inorganic layer disposed in stack.

Figure 3:
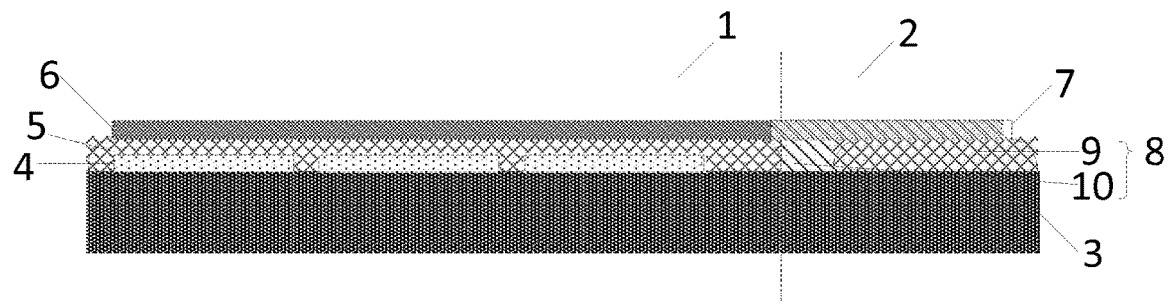
FIG. 3 is a structural schematic diagram of still another array substrate provided in an embodiment of the present disclosure.

Optionally, as shown in FIG. 3, a gap is provided between the encapsulation structure 9 and the encapsulation layer 5, and the thickness compensation layer 8 further includes a filling structure 10 to fill the gap.

As to the array substrate provided in the embodiment of the present disclosure, a gap is provided between the encapsulation layer and the encapsulation structure, therefore, the encapsulation structure will not influence the airtightness of the display area. Especially for flexible devices, even if the encapsulation structure is fractured due to the bending of the surrounding area, since a gap is provided between the encapsulation layer and the encapsulation structure, the sealing effect of the encapsulation layer will not be influenced by such damage as fracture of the encapsulation structure. That is, the array substrate provided in the embodiment of the present disclosure can avoid residue of lead materials, avoid short circuit of a lead, and improve performance and yield of display products without influencing the airtightness of the display area.

As to the array substrate provided in the embodiment of the present disclosure, the encapsulation width of the encapsulation layer can be selected to be the encapsulation width consistent with the encapsulation width in the related technologies.

Figure 4:
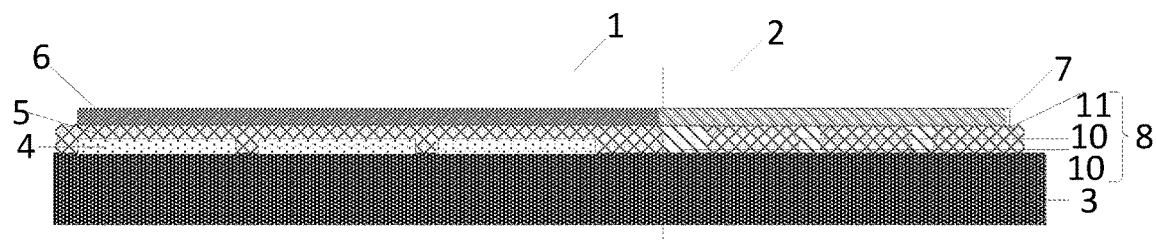
FIG. 4 is a structural schematic diagram of still another array substrate provided in an embodiment of the present disclosure.

Optionally, as shown in FIG. 4, the encapsulation structure includes a plurality of sub-encapsulation structures 11 which are arranged at intervals in a direction from the display area 1 to the surrounding area 2; and the thickness compensation layer 8 further includes filling structures 10 between each of the sub-encapsulation structures.

Optionally, the material of the filling structure is one or a combination of ink-jet printing (IJP) ink and protective adhesive (OC). Of course, other adhesives can also be adopted to perform planarization filling to the gap between the encapsulation layer and the encapsulation structure and/or the gap between sub-encapsulation structures.

Figure 5:
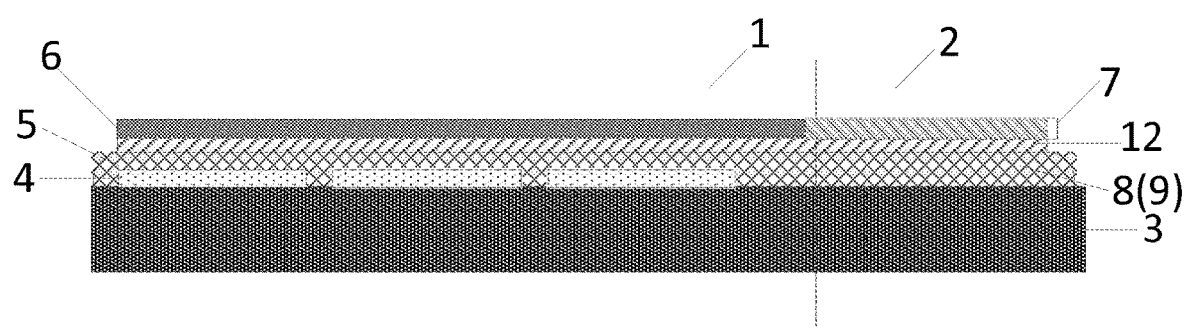
FIG. 5 is a structural schematic diagram of still another array substrate provided in an embodiment of the present disclosure.
Figure 6:
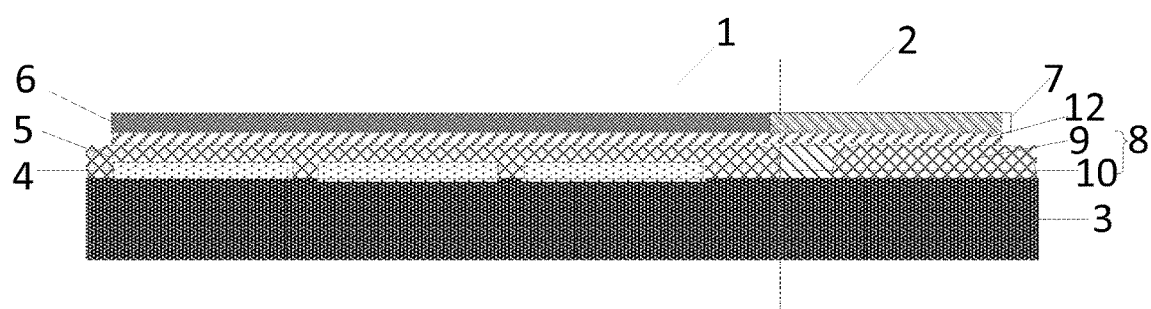
FIG. 6 is a structural schematic diagram of still another array substrate provided in an embodiment of the present disclosure.
Figure 7:
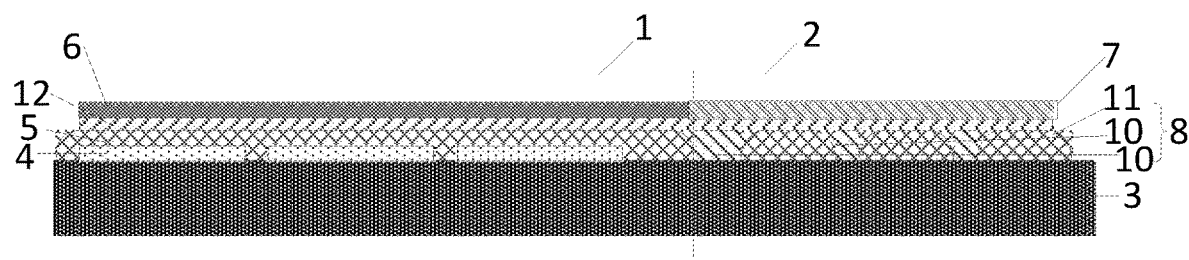
FIG. 7 is a structural schematic diagram of still another array substrate provided in an embodiment of the present disclosure.

Optionally, as shown in FIG. 5 to FIG. 7, the array substrate further includes a protective layer 12 disposed on the encapsulation layer 5 and the thickness compensation layer 8, and the protective layer 12 is disposed under the touch function layer 6.

As to the array substrate provided in the embodiment of the present disclosure, a protective layer is arranged on the encapsulation layer and the thickness compensation layer, thereby further improving the planarization effect and the sealing effect. Moreover, filling structures are arranged in the thickness compensation layer as shown in FIG. 6 and FIG. 7, thereby avoiding damage to the filling structures by subsequent processes, and ensuring product yield.

Optionally, as to the array substrate as shown in FIGS. 1-7 provided in the embodiment of the present disclosure, the distance between the touch lead layer and the substrate in the surrounding area is equal to the distance between the touch function layer and the substrate in the display area, thereby avoiding segment difference of the area in which the touch lead is located, further avoiding residue of lead materials in the process of manufacturing a touch lead, and short circuit of the lead, and improving performance and yield of the display products. Moreover, no additional strong exposure process is required to remove residual lead materials, thereby simplifying the preparation process of an array substrate.

The embodiment of the present disclosure provides a preparation method of an array substrate, and the method includes:

forming, on the substrate, electroluminescent devices, an encapsulation layer and a thickness compensation layer, where the encapsulation layer is configured to encapsulate the electroluminescent devices; where the array substrate is divided into a display area and a surrounding area arranged outside the display area, the electroluminescent devices are located in the display area, and the thickness compensation layer is located in the surrounding area;

forming a touch function layer on the encapsulation layer; where the touch function layer includes a touch lead layer extending from the display area to the surrounding area, and the thickness compensation layer is disposed between the substrate and the touch lead layer.

Optionally, the step of forming, on the substrate, the electroluminescent devices located in the display area, the encapsulation layer configured to encapsulate the electroluminescent devices, and the thickness compensation layer located in the surrounding area specifically includes:

forming, on the substrate, the electroluminescent devices located in the display area; and forming, by adopting a packaging process, the encapsulation layer encapsulating the electroluminescent devices and an encapsulation structure; where the encapsulation structure is formed in the surrounding area and in the same layer as the encapsulation layer.

Optionally, the step of forming, by adopting a packaging process, the encapsulation layer encapsulating the electroluminescent devices and an encapsulation structure; where the encapsulation structure is formed in the surrounding area and in the same layer as the encapsulation layer, includes:

forming, by adopting the packaging process, the encapsulation layer encapsulating the electroluminescent devices and the encapsulation structure, where the encapsulation structure is formed in the surrounding area and in the same layer as the encapsulation layer, and a gap is provided between the encapsulation structure and the encapsulation layer.

Optionally, the packaging process is a discontinuous packaging process.

Optionally, after forming, by adopting the packaging process, the encapsulation layer encapsulating the electroluminescent devices, and the encapsulation structure located in the surrounding area, where the encapsulation structure is formed in the same layer as the encapsulation layer and a gap is provided between the encapsulation structure and the encapsulation layer, the method further includes:

forming a filling structure in the gap between the encapsulation layer and the encapsulation structure.

Optionally, the step of forming the filling structure in the gap between the encapsulation layer and the encapsulation structure specifically includes:

printing ink, by adopting an ink-jet printing process, in the gap between the encapsulation layer and the encapsulation structure;

or, coating OC adhesive in the gap between the encapsulation layer and the encapsulation structure.

Optionally, the step of forming the encapsulation structure located in the surrounding area, where the encapsulation structure is formed in the same layer as the encapsulation layer and a gap is provided between the encapsulation structure and the encapsulation layer, specifically includes:

forming, in the surrounding area, a plurality of sub-encapsulation structures which are arranged at intervals in a direction from the display area to the surrounding area; and after forming the encapsulation structure located in the surrounding area, where the encapsulation structure is formed in the same layer as the encapsulation layer and a gap is provided between the encapsulation structure and the encapsulation layer, the method further includes:

forming filling structures between sub-encapsulation structures.

A discontinuous packaging process can be adopted to form sub-encapsulation structures which are arranged at intervals. Alternatively, patterning is performed on the continuous encapsulation structure, to form a pattern of the sub-encapsulation structures.

The step of forming filling structures between the sub-encapsulation structures specifically includes:

printing ink, by adopting an ink-jet printing process, in gaps between sub-encapsulation structures;

or, coating an OC adhesive in gaps between sub-encapsulation structures.

Optionally, before forming a touch function layer, the method further includes:

forming a protective layer on the encapsulation layer and the thickness compensation layer.

Afterwards, the filling structure formed between the encapsulation layer and the encapsulation structure will be taken as an example to illustrate the preparation method of an array substrate provided in an embodiment of the present disclosure, and the method includes:

S101, forming a buffer layer, a gate insulating layer, a gate layer, an interlayer insulating layer, a source layer and a drain layer, a planarization layer, an anode layer, a pixel definition layer and a supporting layer in sequence on the base substrate;

where the gate layer can include a first gate layer and a second gate layer;

S102, forming a light-emitting function layer in the display area;

S103, forming each film layer of an encapsulation layer; where a discontinuous packaging process is adopted to form the encapsulation layer, and to form an encapsulation structure in the surrounding area; where a gap is provided between the encapsulation layer and the encapsulation structure, and the encapsulation structure includes sub-encapsulation structures arranged at intervals;

S104, performing planarization filling in gap between the encapsulation layer and the encapsulation structure and gaps between sub-encapsulation structures to form filling structures;

where an IJP process can be adopted to perform planarization filling to form filling structures, and other adhesives can also be adopted to perform planarization filling to form filling structures;

S105, forming a protective layer on the encapsulation layer, the filling structures and the sub-packaging structures;

where an atomic layer deposition (ALD) or chemical vapor deposition (CVD) process can be adopted to form a protective layer; and S106, forming a touch function layer on the protective layer.

A display device provided in the embodiment of the present disclosure includes the above array substrate provided in the embodiment of the present disclosure.

The display device provided in the embodiment of the present disclosure can be for example a mobile phone, a computer, a television and other devices.

In summary, as to an array substrate and a preparation method thereof, and a display device provided in the embodiment of the present disclosure, a thickness compensation layer is disposed between the touch lead and the substrate, thereby reducing segment difference of the area in which the touch lead is located, avoiding residue of lead materials in the process of manufacturing a touch lead, avoiding short circuit of the lead, and improving performance and yield of the display products. Moreover, no additional strong exposure process is required to remove residual lead materials, thereby simplifying the preparation process of an array substrate.

Although relative terms such as "on" and "under" are used in the present specification to describe the relative relationship of one component of an icon to another component, these terms used in the present specification are merely for convenience, such as the direction according to the example described in the accompanying drawings. It can be understood that, if the device as shown in the figures is flipped upside down, then the component described to be "on" some component will become the component to be "under" some component. When a structure is "on" the other structure, it may sometimes mean that a structure is formed as a whole on the other structure, or that a structure is "directly" arranged on the other structure, or that a structure is "indirectly" arranged on the other structure through another structure.

In the present specification, the terms "a", "one", "said", "the" and "at least one" are used to indicate the existence of one or more elements/components/etc.; the terms "contain", "include" and "have" are used to mean being open to include and to mean the existence of other elements/components/etc. in addition to the listed elements/components/etc.; and the terms "first", "second" and "third" are only used as markers, rather than as a limitation to the number of objects.

It should be understood that the present disclosure should not limit its application to the detailed structure and arrangement mode of the components presented in the present specification. The present disclosure can have other embodiments and can be implemented and executed in a variety of ways. The aforementioned forms of variation and modification fall within the scope of the present disclosure. It should be understood that, the present disclosure disclosed and limited by the present specification extends to all the alternative combinations of two or more individual characteristics mentioned or apparent in the text and/or drawings. All of these different combinations constitute multiple alternative aspects of the present disclosure. The embodiments described in the present specification describe the best known manners for achieving the present disclosure and will enable those skilled in the art to take advantage of the present disclosure.

Evidently those skilled in the art can make various modifications and variations to the embodiment of the present disclosure without departing from the spirit and scope of the present disclosure. Thus the present disclosure is also intended to encompass these modifications and variations thereto so long as the modifications and variations come into the scope of the claims appended to the present disclosure and their equivalents.

The invention claimed is:

1. An array substrate, comprising a display area and a surrounding area arranged outside the display area; wherein the array substrate comprises:
    a substrate;
    electroluminescent devices and an encapsulation layer disposed on the substrate in the display area, wherein the encapsulation layer is configured to encapsulate the electroluminescent devices;
    a touch function layer disposed on the encapsulation layer, wherein the touch function layer comprises a touch lead layer extending from the display area to the surrounding area; and
    a thickness compensation layer located in the surrounding area and disposed between the substrate and the touch lead layer, wherein a distance between the substrate and a side, facing away from the substrate, of the thickness compensation layer is substantially equal to a distance between the substrate and a side, facing away from the substrate, of the encapsulation layer.

2. The array substrate of claim 1, wherein the thickness compensation layer comprises an encapsulation structure which is disposed in a same layer as the encapsulation layer.

3. The array substrate of claim 2, wherein a gap is provided between the encapsulation structure and the encapsulation layer, and the thickness compensation layer further comprises a filling structure filling the gap.

4. The array substrate of claim 2, wherein the encapsulation structure comprises a plurality of sub-encapsulation structures which are arranged at intervals in a direction from the display area to the surrounding area; and the thickness compensation layer further comprises filling structures filling in gaps between the plurality of sub-encapsulation structures.

5. The array substrate of claim 3, wherein a material of the filling structure is one or a combination of ink-jet printing ink and protective adhesive.

6. The array substrate of claim 1, wherein the array substrate further comprises a protective layer disposed on the encapsulation layer and the thickness compensation layer, and disposed under the touch function layer.

7. The array substrate of claim 1, wherein a distance between the touch lead layer and the substrate in the surrounding area is equal to a distance between the touch function layer and the substrate in the display area.

8. A display device, comprising the array substrate in claim 1.

9. The display device of claim 8, wherein the thickness compensation layer comprises an encapsulation structure which is disposed in a same layer as the encapsulation layer.

10. The display device of claim 9, wherein a gap is provided between the encapsulation structure and the encapsulation layer, and the thickness compensation layer further comprises a filling structure filling the gap.

11. The display device of claim 9, wherein the encapsulation structure comprises a plurality of sub-encapsulation structures which are arranged at intervals in a direction from the display area to the surrounding area; and the thickness compensation layer further comprises filling structures filling in gaps between the plurality of sub-encapsulation structures.

12. The display device of claim 10, wherein a material of the filling structure is one or a combination of ink-jet printing ink and protective adhesive.

13. The display device of claim 8, wherein the array substrate further comprises a protective layer disposed on the encapsulation layer and the thickness compensation layer, and disposed under the touch function layer.

14. The display device of claim 8, wherein a distance between the touch lead layer and the substrate in the surrounding area is equal to a distance between the touch function layer and the substrate in the display area.

15. The array substrate of claim 4, wherein a material of the filling structures is one or a combination of ink-jet printing ink and protective adhesive.

16. A preparation method of an array substrate, comprising:
forming, on a substrate, electroluminescent devices, an encapsulation layer and a thickness compensation layer; wherein the encapsulation layer is configured to encapsulate the electroluminescent device;
wherein the array substrate comprises a display area and a surrounding area arranged outside the display area, and the electroluminescent device is located in the display area, and the thickness compensation layer is located in the surrounding area; and
forming a touch function layer on the encapsulation layer, wherein the touch function layer comprises a touch lead layer extending from the display area to the surrounding area, and the thickness compensation layer is disposed between the substrate and the touch lead layer,
wherein a distance between the substrate and a side, facing away from the substrate, of the thickness compensation layer is substantially equal to a distance between the substrate and a side, facing away from the substrate, of the encapsulation layer.

17. The method of claim 16, wherein the step of forming, on a substrate, the electroluminescent devices and the encapsulation layer located in the display area, and a thickness compensation layer located in the surrounding area, wherein the encapsulation layer is configured to encapsulate the electroluminescent devices, specifically comprises:
forming the electroluminescent devices on the substrate in the display area; and
forming, by adopting a packaging process, the encapsulation layer and an encapsulation structure; wherein the encapsulation layer is formed to encapsulate the electroluminescent devices, and encapsulation structure is formed in the surrounding area and in the same layer as the encapsulation layer.

* * * * *